United States Patent
Park et al.

(10) Patent No.: US 7,629,221 B2
(45) Date of Patent: Dec. 8, 2009

(54) METHOD FOR FORMING CAPACITOR OF SEMICONDUCTOR DEVICE

(75) Inventors: Ki Seon Park, Kyoungki-do (KR); Jae Sung Roh, Kyoungki-do (KR); Hyun Chul Sohn, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 320 days.

(21) Appl. No.: 11/173,089

(22) Filed: Jul. 1, 2005

(65) Prior Publication Data

US 2006/0270177 A1    Nov. 30, 2006

(30) Foreign Application Priority Data

May 27, 2005    (KR)    .................. 10-2005-0045068

(51) Int. Cl.
    *H01L 21/20* (2006.01)
(52) U.S. Cl. .............. 438/386; 257/304; 257/311; 257/295; 257/750; 257/751; 257/306; 257/303; 257/310; 257/763; 438/396; 438/694; 438/710; 438/712; 438/722; 438/240; 438/239; 438/595; 438/387; 438/253; 438/628; 438/636; 438/644; 438/654; 438/680
(58) Field of Classification Search .................. 438/386
    See application file for complete search history.

(56) References Cited

U.S. PATENT DOCUMENTS

| | | | | |
|---|---|---|---|---|
| 5,352,622 | A * | 10/1994 | Chung .................. | 438/396 |
| 5,892,254 | A * | 4/1999 | Park et al. .................. | 257/295 |
| 6,020,248 | A * | 2/2000 | Zenke .................. | 438/398 |
| 6,177,351 | B1 * | 1/2001 | Beratan et al. .................. | 438/694 |
| 6,222,220 | B1 * | 4/2001 | Lin et al. .................. | 257/306 |
| 6,284,589 | B1 * | 9/2001 | Lim et al. .................. | 438/240 |
| 6,291,250 | B1 * | 9/2001 | Igarashi .................. | 438/3 |
| 6,320,213 | B1 * | 11/2001 | Kirlin et al. .................. | 257/295 |
| 6,365,328 | B1 * | 4/2002 | Shen et al. .................. | 430/313 |
| 6,486,531 | B2 * | 11/2002 | Oh .................. | 257/532 |
| 6,500,763 | B2 * | 12/2002 | Kim et al. .................. | 438/689 |
| 6,518,610 | B2 * | 2/2003 | Yang et al. .................. | 257/295 |
| 6,573,553 | B2 * | 6/2003 | Nakamura .................. | 257/309 |
| 6,635,523 | B1 * | 10/2003 | Uchiyama et al. .................. | 438/239 |

(Continued)

FOREIGN PATENT DOCUMENTS

KR    1020010004967    1/2001

(Continued)

OTHER PUBLICATIONS

Korean Patent Gazette, Oct. 30, 2006.

*Primary Examiner*—Fernando L Toledo
*Assistant Examiner*—Ankush k Singal
(74) *Attorney, Agent, or Firm*—Ladas & Parry LLP

(57) ABSTRACT

Disclosed is a method for forming a capacitor of a semiconductor device. In such a method, a mold insulating layer is formed on an insulating interlayer provided with a storage node plug, and the mold insulating layer is etched to form a hole through which the storage node plug is exposed. Next, a metal storage electrode with an interposed WN layer is formed on a hole surface including the exposed storage node plug and the mold insulating layer is removed. Finally, a dielectric layer and a plate electrode are formed in order on the metal storage electrode.

19 Claims, 6 Drawing Sheets

U.S. PATENT DOCUMENTS

| | | | |
|---|---|---|---|
| 6,656,784 B2 * | 12/2003 | Pakr | 438/239 |
| 6,740,554 B2 * | 5/2004 | Yang et al. | 438/240 |
| 6,759,293 B2 * | 7/2004 | Cho et al. | 438/253 |
| 6,764,863 B2 * | 7/2004 | Sheu et al. | 438/3 |
| 6,905,547 B1 * | 6/2005 | Londergan et al. | 118/715 |
| 7,144,772 B2 * | 12/2006 | Lee et al. | 438/244 |
| 7,153,750 B2 * | 12/2006 | Chung et al. | 438/393 |
| 7,259,057 B2 * | 8/2007 | Choi | 438/238 |
| 7,276,300 B2 * | 10/2007 | Gabric et al. | 428/698 |
| 2003/0109124 A1 * | 6/2003 | Nakamura et al. | 438/597 |
| 2003/0121132 A1 * | 7/2003 | Oh et al. | 29/29 |
| 2003/0124798 A1 * | 7/2003 | Lim et al. | 438/253 |
| 2004/0051131 A1 * | 3/2004 | Miyajima | 257/306 |
| 2004/0126983 A1 * | 7/2004 | Kim | 438/396 |
| 2004/0232463 A1 * | 11/2004 | Chung et al. | 257/296 |
| 2004/0259308 A1 * | 12/2004 | Chung et al. | 438/253 |
| 2005/0023640 A1 * | 2/2005 | Choi et al. | 257/532 |
| 2005/0142767 A1 * | 6/2005 | Jin | 438/281 |
| 2005/0280066 A1 * | 12/2005 | Lee et al. | 257/310 |
| 2005/0287737 A1 * | 12/2005 | Park et al. | 438/239 |
| 2006/0014385 A1 * | 1/2006 | Kim et al. | 438/680 |
| 2006/0040457 A1 * | 2/2006 | Lee et al. | 438/381 |
| 2006/0046398 A1 * | 3/2006 | McDaniel et al. | 438/279 |
| 2006/0097299 A1 * | 5/2006 | Ahn et al. | 257/295 |
| 2006/0099760 A1 * | 5/2006 | Kim et al. | 438/250 |
| 2006/0113578 A1 * | 6/2006 | Chung et al. | 257/303 |
| 2006/0138511 A1 * | 6/2006 | Chung et al. | 257/296 |
| 2006/0186452 A1 * | 8/2006 | Nam et al. | 257/308 |
| 2006/0263977 A1 * | 11/2006 | Kim et al. | 438/253 |
| 2007/0040203 A1 * | 2/2007 | Lee et al. | 257/303 |
| 2007/0152256 A1 * | 7/2007 | Iizuka et al. | 257/306 |
| 2007/0167006 A1 * | 7/2007 | Chung et al. | 438/680 |

FOREIGN PATENT DOCUMENTS

| | | |
|---|---|---|
| KR | 1020030003355 | 1/2003 |
| KR | 1020040009245 | 1/2004 |
| KR | 1020040100502 | 12/2004 |

* cited by examiner

METHOD FOR FORMING CAPACITOR OF SEMICONDUCTOR DEVICE

BACKGROUND OF THE INVENTION

1. Field of the Invention

The present invention relates generally to a method for forming a capacitor of a semiconductor device, and more particularly to a method for forming a capacitor of a semiconductor device, which can prevent defect occurrence due to infiltration of an etching solution into a TiN layer applied as material of a cylinder-type storage electrode.

2. Description of the Prior Art

With the rapid increase in demand for semiconductor memory devices, a variety of technologies have been proposed to obtain a high-capacity capacitor. In general, a capacitor has a structure in which a dielectric layer is interposed between a storage electrode and a plate electrode, and its capacity is proportional to an electrode surface area and a dielectric constant of a dielectric layer while being inversely proportional to an inter-electrode distance, that is, a thickness of a dielectric layer. For obtaining a high-capacity capacitor, therefore, it is necessary to use a dielectric layer having a high dielectric constant, to enlarge the electrode surface area and to reduce the inter-electrode distance.

However, since there is a limit to the reduction of the inter-electrode distance, that is, the thickness of a dielectric layer, current researches for ensuring sufficient charging capacity are progressing toward the enlargement of the electrode surface area and the development of a new dielectric layer having a higher dielectric constant.

For example, whereas the existing storage electrodes have employed a concave-type structure in which only inner surfaces of the electrode are used, the latest highlighted storage electrodes employ a cylinder-type structure in which outer surfaces as well as inner surfaces of the electrode are used together and thus its electrode surface area is enlarged. Also, ONO has been used as the existing dielectric layer material, but a single layer or a laminate layer of high dielectric constant material(s) such as Al2O3, Ta2O5, HfO2 and the like is in the spotlight.

Moreover, research for ensuring sufficient charging capacity aims at the development of not only the dielectric layer itself, but also the electrode material used. To be specific, polysilicon has been mainly used as storage electrode material, but vigorous research is currently being pursued to apply metal, such as TiN, as the storage electrode material. This is because TiN is easy to remove a native surface oxide and can sufficiently reduce an effective oxide thickness whereas polysilicon is limited in reducing the effective oxide thickness due to the native surface oxide.

However, when a TiN layer is applied as the storage electrode material to form a cylinder-type structure, the following problem occurs:

In general, in order to form a cylinder-type capacitor, a wet etching process called 'dip-out' is needed to remove a mold insulating layer used for obtaining a cylinder structure after a cylinder-type storage electrode has been formed. However, when a TiN layer is applied as the storage electrode material, defect sources such as pin holes or micro cracks which may exist within the TiN layer cause a defect that a lower oxide layer (that is, insulating interlayer) or a lower storage node plug material that is, polysilicon) is lost in the course of the dip-out process.

Here, the defect occurring in the dip-out process can be divided into two types. One type is that the lower oxide layer is lost directly due to an etching solution infiltrating through local defect sources which exist within the TiN layer, and the other type is that composition of BOE which is used as chemicals in a bottom portion inside of a narrow contact hole for the storage electrode changes to increase a concentration of NH4F relative to HF, so that the lower storage node plug material, that is, polysilicon coming in contact with the local defect sources of the TiN layer, is lost first and then the oxide layer around the lower storage node plug material is lost.

FIGS. 1 to 3 are photographs and a corresponding sectional view showing defect occurrence of the former type and FIG. 4 is a photograph showing defect occurrence of the latter type.

Referring to FIGS. 1 to 3, it can be seen that an etching solution infiltrates into a lower oxide layer, that is, an insulating interlayer through defect sources such as pin holes or micro cracks existing within a TiN layer as storage electrode material, which causes a defect that the insulating interlayer is lost.

Referring to FIG. 4, in the course of a dip-out process, concentrations of NH4F and HF constituting a 20:1 BOE solution may deviate from an equilibrium state in a bottom portion inside of a narrow cylinder with the result that a concentration of NH4F becomes higher than that of HF. In such a condition, as defect sources such as pin holes or micro cracks exist within a TiN layer, a reaction according to the following reaction formula may occur in a region coming in contact with a lower storage node plug consisting of polysilicon, so that the storage node plug may be lost and subsequently an insulating interlayer may be removed to produce a circular defect.

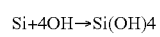

Si+4OH→Si(OH)4

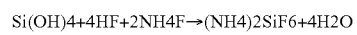

Si(OH)4+4HF+2NH4F→(NH4)2SiF6+4H2O

In FIGS. 1 to 4, reference numeral '1' designates a semiconductor substrate, reference numeral '2' designates the insulating interlayer, reference numeral '3' designates the storage node plug, reference numeral '4' designates an etching stopper nitride layer, reference numeral '5' designates a cylinder-type TiN storage electrode, reference numeral 'A' designates the defect source, reference numeral 'B' designates a bunker defect and reference numeral 'C' designates the circular defect.

In a case where a Ru layer, instead of the TiN layer, is applied as storage electrode material to form a cylinder-type structure, the above-mentioned defect also occurs.

SUMMARY OF THE INVENTION

Accordingly, the present invention has been made to solve the above-mentioned problem occurring in the prior art, and an object of the present invention is to provide a method for forming a capacitor of a semiconductor device, which can prevent defect occurrence due to infiltration of an etching solution during a subsequent dip-out process.

A further object of the present invention is to provide a method for forming a capacitor of a semiconductor device, which can improve production yield by preventing defect occurrence due to infiltration of an etching solution during a subsequent dip-out process.

In order to accomplish these objects, there is provided a method for forming a capacitor of semiconductor device in accordance with one aspect of the present invention, the method comprising the steps of: forming a mold insulating layer on an insulating interlayer provided with a storage node plug; etching the mold insulating layer to form a hole through which the storage node plug is exposed; forming a metal storage electrode with an interposed WN layer on a hole surface including the exposed storage node plug; removing the mold insulating layer; and forming a dielectric layer and a plate electrode in order on the metal storage electrode.

Here, the storage node plug consists of polysilicon, and the polysilicon storage node plug is formed, on its upper surface, with a metal silicide layer.

The metal silicide layer is formed by a process comprising the steps of: depositing a transient metal layer on the insulating interlayer formed with the polysilicon storage node plug; progressing rapid thermal processing of the resultant product formed with the transient metal layer; and removing the transient metal layer having been unreacted during the rapid thermal processing.

Preferably, the transient metal layer is a Ti layer and the metal silicide layer is a TiSi2 layer.

Also, the method according to the present invention further comprises the step of forming an etching stopper nitride layer on the insulating interlayer before the step of forming the mold insulating layer.

The mold insulating layer is preferably an oxide layer.

The metal storage electrode with the interposed WN layer has a laminate structure of a first TiN layer, a WN layer and a second TiN layer.

The first and second TiN layers are formed by a CVD process or an ALD process.

The first and second TiN layers are formed with a thickness of 100 to 200 Å at a temperature of 400 to 700° C. using TiCl4 source gas and NH3 reaction gas according to a CVD process.

The metal storage electrode with the interposed WN layer has a laminate structure of a first Ru layer, a WN layer and a second Ru layer.

The first and second Ru layers are formed with a thickness of 100 to 200 Å according to a CVD process or an ALD process.

The WN layer is formed in an amorphous state according to an ALD process repeatedly performing a deposition cycle, in which 'B2H6 gas flowing, purging, Wf6 gas flowing, purging, NH3 gas flowing and purging' successively progress, until a desired thickness is obtained.

Ar gas or a gas mixture of Ar and H2 is used as the purge gas.

The WN layer is formed with a thickness of 20 to 100 Å at a temperature of 250 to 350° C.

The step of forming the metal storage electrode with the interposed WN layer on the hole surface comprises the steps of: forming the metal layer with the interposed WN layer on the mold insulating layer including the hole; forming a sacrifice layer on the metal layer with the interposed WN layer to fill up the hole with the sacrifice layer; removing the sacrifice layer and the metal layer with the interposed WN layer on the mold insulating layer to expose the mold insulating layer; and removing the residual sacrifice layer.

The sacrifice layer is any one selected from the group consisting of a PE-TEOS oxide layer, a SOG oxide layer and a photoresist layer.

The sacrifice layer is formed with a thickness of 500 to 3000 Å.

The dielectric layer is any single layer selected from the group consisting of Al2O3, HfO2, La2O3, TiO2 and SrTiO3 layers according to an ALD process or a laminate layer including at least two of them.

The plate electrode consists of a TiN layer according to a CVD process.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
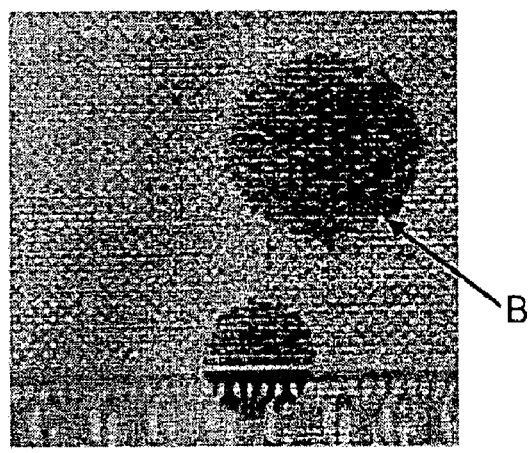
FIGS. 1 to 4 are photographs and a sectional view for explaining a problem in the prior art.
Figure 2:
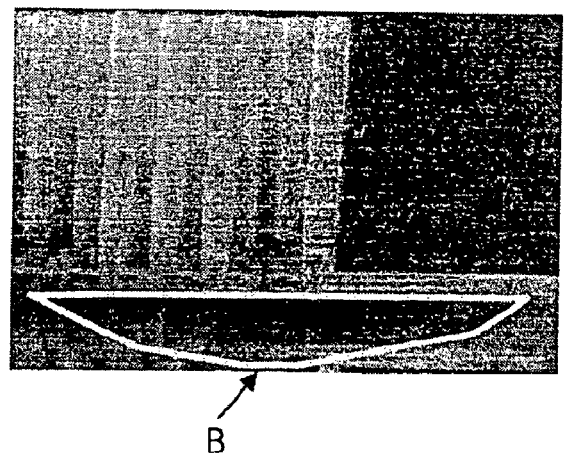
Figure 3:
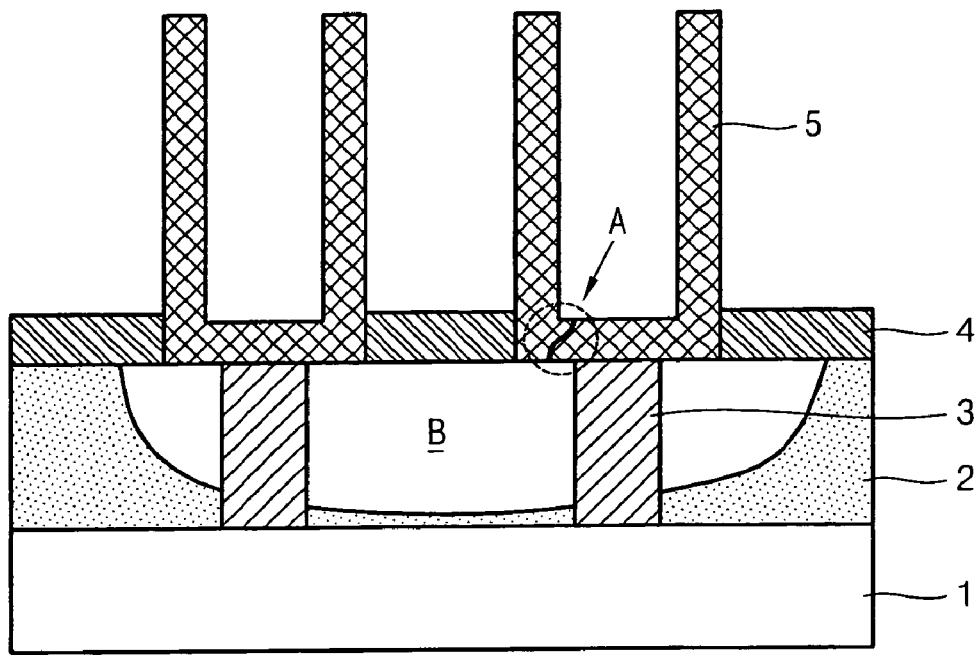
Figure 4:
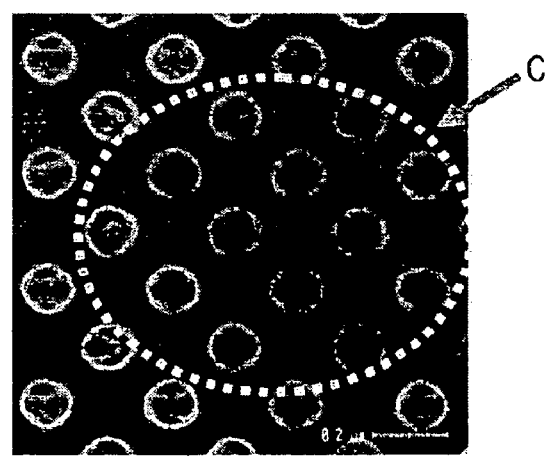

Hereinafter, preferred embodiments of the present invention will be described with reference to the accompanying drawings. In the following description and drawings, the same reference numerals are used to designate the same or similar components, and so repetition of the description on the same or similar components will be omitted.

Hereinafter, first of all, a technical principle of the present invention will be described.

Figure 5A:
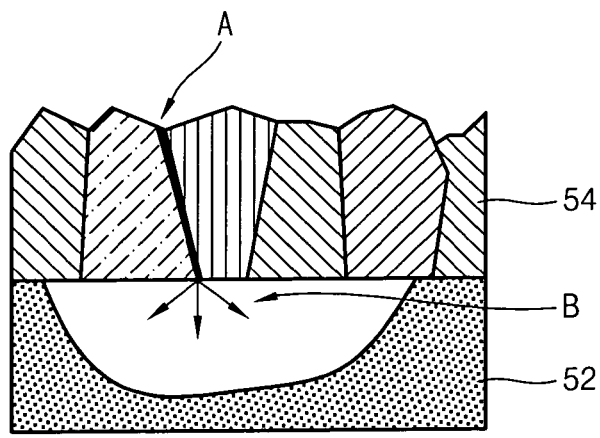
FIGS. 5a and 5b are schematic views for explaining a conventional storage electrode and a storage electrode according to the present invention.

As shown in FIG. 5a, since a TiN layer 54 usually grows into a columnar structure in a CVD process, not only its surface is rough, but also defect sources A such as pin holes or micro cracks exist at interfaces between crystal grains. In a subsequent dip-out process, an etching solution infiltrates through such defect sources into a lower oxide layer, that is, insulating interlayer 52, which causes the insulating interlayer 52 to be lost and thus results in a defect B.

Here, such a problem occurs in a case of depositing a TiN layer through an ALD (Atomic Layer Deposition) process as well as in the CVD process.

Figure 5B:
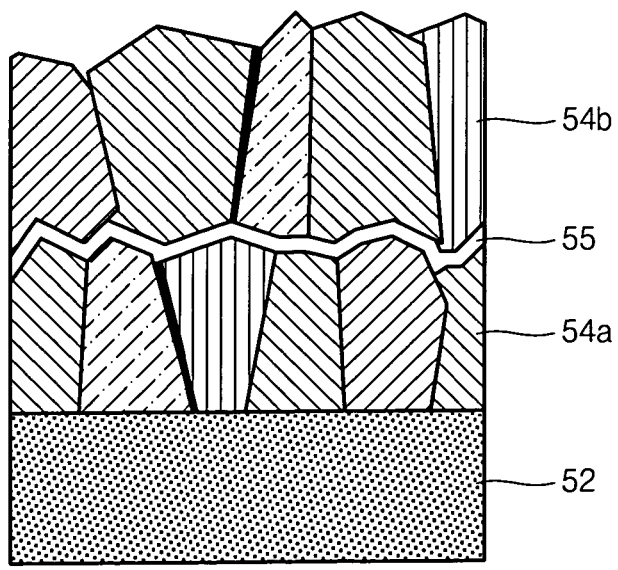

In order to solve this problem, as shown in FIG. 5b, the present invention proposes that a TiN layer for a storage electrode is also deposited by a CVD process or an ALD process, but a first TiN layer 54a and a second layer 54b are separately deposited and an amorphous WN layer 55 as a buffer layer is interposed between the first and second TiN layers 54a, 54b according to an ALD process.

In this way, crystal orientations in the columnar structure of the TiN layer are deviated from each other and, in particular, the amorphous ALD WN layer 55 interrupts infiltration paths of the etching solution, so that defect occurrence due to the infiltration of the etching solution can be effectively suppressed in the subsequent dip-out process after the formation of the cylinder-type storage electrode. Consequently, not only reliability and production yield of a capacitor itself, but also production yield of a semiconductor device can be all improved.

Hereinafter, a detailed description will be given for a method of forming a capacitor of a semiconductor device in accordance with a preferred embodiment of the present invention with reference to FIGS. 6a to 6d which show process-by-process sectional views.

Figure 6A:
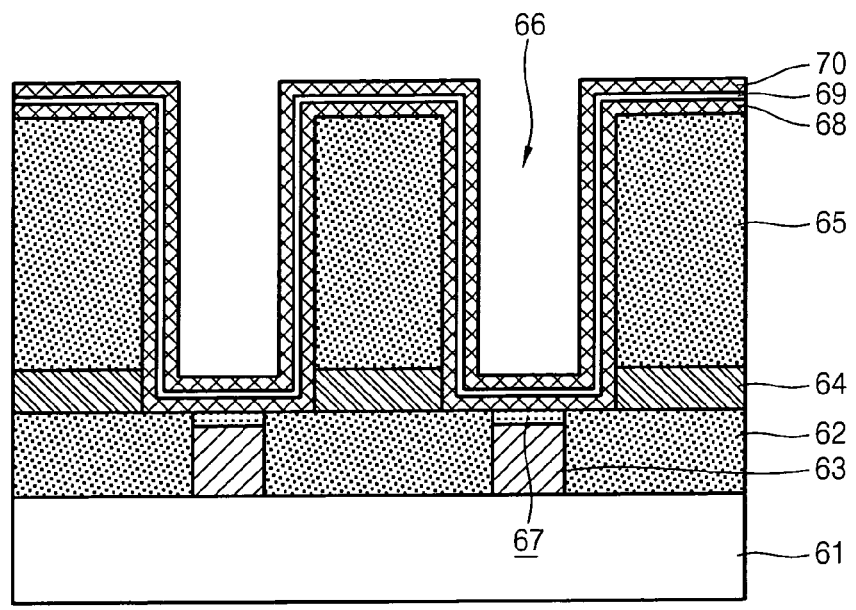
FIGS. 6a to 6d are process-by-process sectional views for explaining a method for forming a capacitor in accordance with a preferred embodiment of the present invention.

Referring to FIG. 6a, a semiconductor substrate 61 formed with a predetermined lower pattern (not shown) including a transistor and a bit line is prepared. Next, an insulating interlayer 62 is formed on the entire surface of the substrate 61 such that the lower pattern is cover with the insulating interlayer 62, and then the insulating interlayer 62 is etched to form a contact hole. Subsequently, a polysilicon layer is deposited on the insulating interlayer 62 such that the contact hole is filled up with the polysilicon layer, and then the polysilicon layer is etched back or subjected to CMP (Chemical mechanical Polishing) to form a storage node plug 63 consisting of polysilicon.

Next, a nitride layer 64 as an etching stopper is deposited on the insulating interlayer 62 including the storage node plug 63, and then a mold insulating layer 65 for forming a cylinder type structure of a storage electrode is deposited on the nitride layer 64. Preferably, an oxide layer is used as the mold insulating layer 65. Subsequently, the mold insulating layer 65 is etched using the nitride layer 64, and then the nitride layer 64 is etched to form a hole 66 through which the storage node plug 63 is exposed.

In succession, a transient metal layer, for example, a Ti layer (not shown) is deposited on the resultant product including a surface of the storage node plug 63, and then the resultant substrate is subjected to rapid thermal processing to form a TiSi2 layer 67 as a barrier layer on the surface of the storage node plug 63.

Next, the unreacted Ti layer is removed according to any well-known process, and then a first TiN layer 68 is deposited on a surface of the hole 66 including the TiSi2 layer 67 and on the mold insulating layer 65 according to a CVD process or an ALD process. At this time, in a case of using the CVD process, the first TiN layer 68 is deposited with a thickness of 100 to 200 Å at a temperature of 400 to 700° C. using TiCl4 source gas and NH3 reaction gas.

Next, a WN layer 69 as a buffer layer is deposited with a thickness of 20 to 100 Å at a temperature of 250 to 300° C. on the first TiN layer 68. Here, the WN layer 69 is deposited in an amorphous state according to an ALD process repeatedly performing a deposition cycle, in which 'B2H6 gas flowing, purging, Wf6 gas flowing, purging, NH3 gas flowing and purging' successively progress, until a desired thickness is obtained. At this time, Ar gas or a gas mixture of Ar and H2 may be used as the purge gas.

In succession, a second TiN layer 70 is deposited on the WN layer 69 under the same condition and the same thickness as those in the deposition of the first TiN layer 68. In this way, a laminate layer of the first TiN layer 68, the WN layer 69 and the second TiN layer 70 is formed.

Figure 6B:
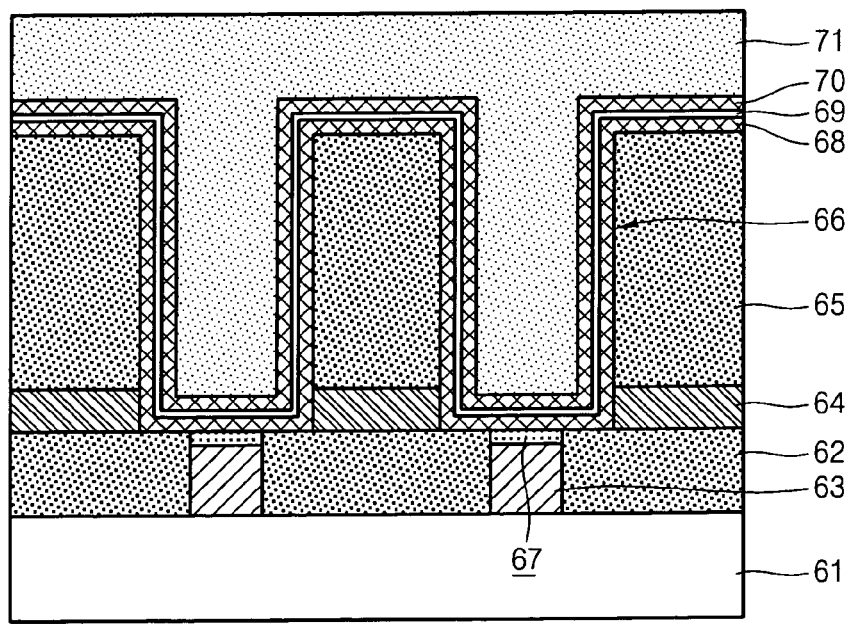

Referring to FIG. 6*b*, a sacrifice layer 71 for separating adjacent electrodes is deposited on the resultant substrate, that is, the second TiN layer 70. Such a sacrifice layer 71 serves as a barrier layer for a subsequent CMP or etch back process. Here, PE-TEOS oxide layer or SOG oxide layer may be used as the sacrifice layer 71, and the sacrifice layer 71 is deposited with a thickness enough to completely fill up the hole 66, preferably a thickness of 500 to 3000 Å.

It is also possible to use a photoresist layer as the barrier layer for the CMP or etch back process in place of the above-mentioned oxide layers.

Figure 6C:
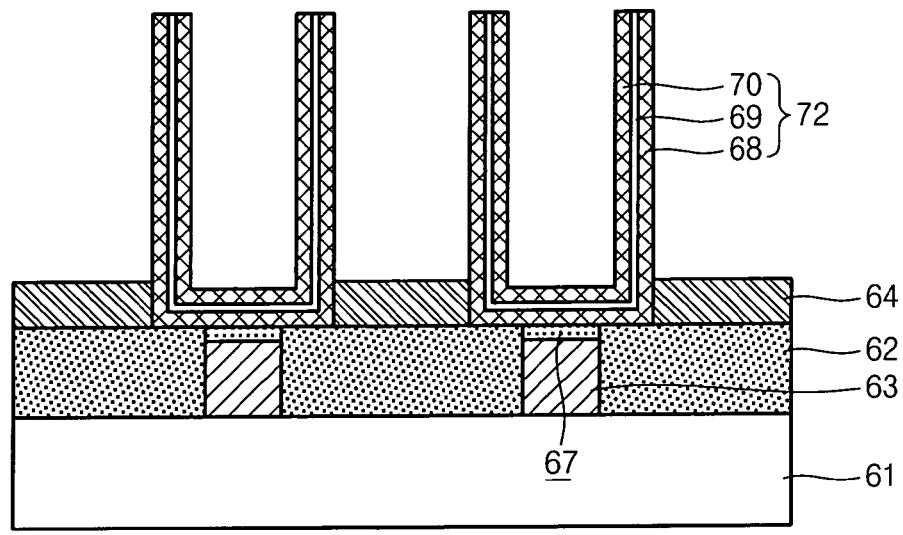

Referring to FIG. 6*c*, portions of the first TiN layer 68, the WN layer 69 and the second TiN layer 70 on the sacrifice layer surface and the mold insulating layer are removed by the CMP or etch back process until the mold insulating layer is exposed such that adjacent electrodes are separated from each other. Subsequently, the resultant substrate is subjected to a dip-out process to remove the mold insulating layer and the residual sacrifice layer. In this way, a cylinder-type storage electrode 72 is formed. At this time, the dip-out process is performed using a 20:1 BOE solution, and its process time may be adjusted dependent on kinds of the mold insulating layer.

In conventional methods, the etching solution infiltrates into a lower portion through defect sources within the TiN layer during the dip-out process and thus a defect, for example, a loss of the lower insulting interlayer or polysilicon of the storage node plug occurs. However, in the present invention, the TiN layer is constructed such that it is separated into two layer, that is, the first and second TiN layers 68, 70 and the amorphous WN layer 69 is interposed between the first and second TiN layers 68, 70. As a result of this, the infiltration of the etching solution into the lower portion can be securely prevented.

That is to say, since the storage electrode 72 according to the present invention has a laminate structure of the first and second TiN layers 68, 70, crystal orientations are deviated from each other and thus infiltration paths of the etching solution are lengthened. In particular, the amorphous WN layer 69 is further interposed between the first and second TiN layers 68, 70 to interrupt the infiltration of the etching solution into the lower portion. In the present invention, accordingly, defect occurrence due to the infiltration of the etching solution during the dip-out process is effectively prevented and ultimately the lowering of production yield can be prevented.

Figure 6D:
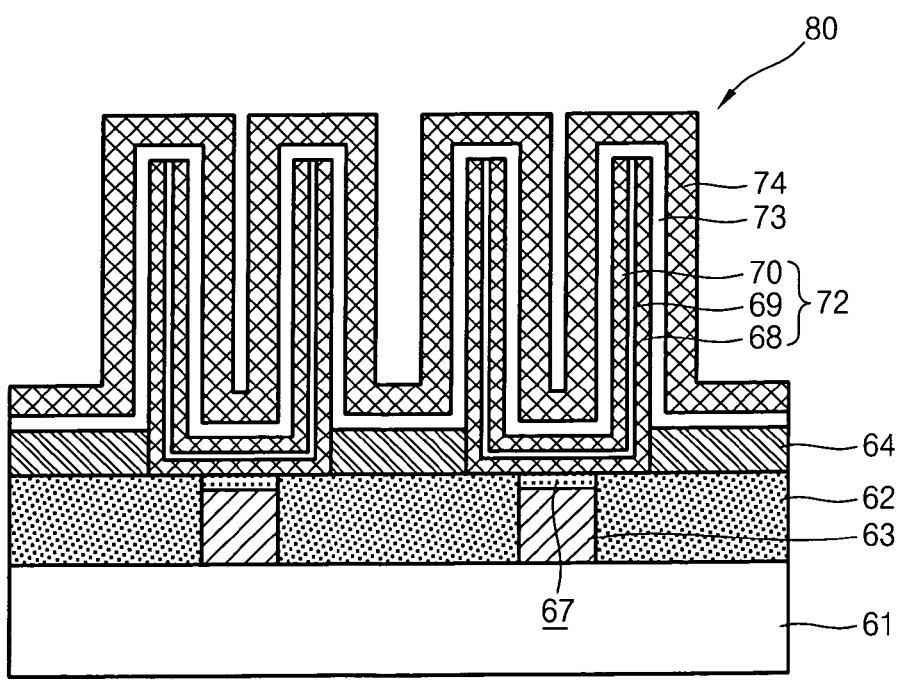

Referring FIG. 6*d*, a dielectric layer 73 is formed on the cylinder-type storage electrode 72. Here, the dielectric layer 73 may be any single layer selected from the group consisting of Al2O3, HfO2, La2O3, TiO2 and SrTiO3 layers according to an ALD process or a laminate layer including at least two of them. Subsequently, a plate electrode 74 of TiN is formed on the dielectric layer 73 according to a CVD process, thereby completing the formation of the capacitor 80 of the present invention.

In the above-mentioned embodiment, the TiN layer is applied as the cylinder-type storage electrode material, but similar effect can also be obtained by interposing the amorphous WN layer as a buffer layer in a case of applying a CVD Ru layer or an ALD Ru layer.

Figure 7:
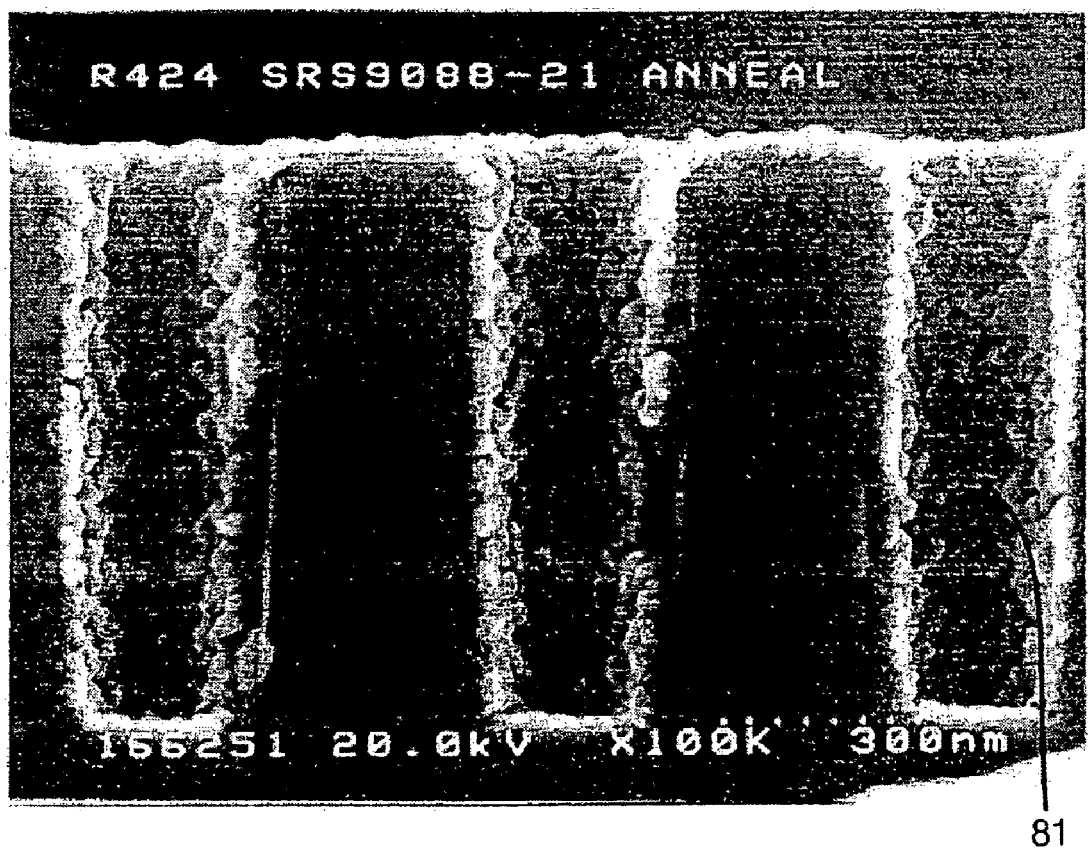
FIG. 7 is a photograph showing a state where grain agglomeration occurs in a case of using a CVD Ru layer as storage electrode material.

That is, as shown in FIG. 7 which is a photograph showing a state where grain agglomeration occurs in a case of using a CVD Ru layer as storage electrode material, the grain agglomeration easily occurs even by a low-temperature thermal process when the CVD Ru layer is applied as storage electrode material, which makes it difficult to realize the cylinder-type structure using the dip-out process. Reference numeral '81' designates the CVD Ru layer where the grain agglomeration has occurred.

However, by forming the CVD or ALD Ru layer in a two-layer structure and interposing the amorphous ALD WN layer between the two layers as in the above-mentioned embodiment of the present invention (although not shown), it is possible to prevent defect occurrence during a subsequent dip-out process and thus to realize the cylinder-type structure.

As described above, according to the present invention, a TiN layer as storage electrode material is deposited in a two-layer structure of a first TiN layer and a second TiN layer and an amorphous WN layer is interposed between the first and second TiN layers, as a result of which infiltration of an etching solution during a subsequent dip-out process can be effectively prevented by virtue that crystal orientations are deviated from each other and the ALD WN layer interrupts the infiltration of the etching solution. Accordingly, reliability of a capacitor manufactured by the present method and its production yield as well as production yield of a semiconductor device including such a capacitor can be improved.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for forming a capacitor of semiconductor device, the method comprising the steps of:
    forming a mold insulating layer on an insulating interlayer provided with a storage node plug, wherein the storage node plug consists of polysilicon and wherein the polysilicon storage plug is formed, on its upper surface, with a metal silicide layer;
    etching the mold insulating layer to form a hole through which the storage node plug is exposed;
    forming a metal storage electrode with an interposed WN layer on a hole surface including the exposed storage node plug;
    removing the mold insulating layer; and
    forming a dielectric layer and a plate electrode in order on the metal storage electrode, wherein the metal storage electrode with the interposed WN layer has a laminate structure of a first TiN layer, a WN layer and a second TiN layer and wherein the first and second TiN layers are formed by a Chemical Vapor Deposition (CVD) process or an Atomic Layer Deposition ALD) process.

2. The method as claimed in claim 1, wherein the metal silicide layer is formed by a process comprising the steps of:
    depositing a transient metal layer on the insulating interlayer formed with the polysilicon storage node plug;
    progressing rapid thermal processing of the resultant product formed with the transient metal layer; and
    removing the transient metal layer having been unreacted during the rapid thermal processing.

3. The method as claimed in claim 1, further comprising the step of forming an etching stopper nitride layer on the insulating interlayer before the step of forming the mold insulating layer.

4. The method as claimed in claim 1, wherein the mold insulating layer is an oxide layer.

5. The method as claimed in claim 1, wherein the first and second metal layers are formed at a temperature of 400 to 700° C. using TiCl4 source gas and NH3 reaction gas according to a Chemical Vapor Deposition (CVD) process.

6. The method as claimed in claim 1, wherein the first and second metal layers have a thickness of 100 to 200 Å, respectively.

7. The method as claimed in claim 2, wherein the transient metal layer is a Ti layer and the metal silicide layer is a TiSi2 layer.

8. A method for forming a capacitor of semiconductor device, the method comprising the steps of:
    forming a mold insulating layer on an insulating interlayer provided with a storage node plug;
    etching the mold insulating layer to form a hole through which the storage node plug is exposed;
    forming a metal storage electrode with an interposed WN layer on a hole surface including the exposed storage node plug;
    removing the mold insulating layer; and
    forming a dielectric layer and a plate electrode in order on the metal storage electrode, wherein the metal storage electrode with the interposed WN layer has a laminate structure of a first Ru layer, a WN layer and a second Ru layer.

9. The method as claimed in claim 8, wherein the first and second Ru layers are formed according to a Chemical Vapor Deposition (CVD) process or an Atomic Layer Deposition (ALD) process.

10. The method as claimed in claim 8, wherein the first and second Ru layers have a thickness of 100 to 200 Å, respectively.

11. The method as claimed in claim 8, wherein the WN layer is formed in an amorphous state according to an Atomic Layer Deposition (ALD) process repeatedly performing a deposition cycle, in which 'B2H6 gas flowing, purging, WF6 gas flowing, purging, NH3 gas flowing and purging' successively progress, until a desired thickness is obtained.

12. The method as claimed in claim 8, wherein the step of forming the metal storage electrode with the interposed WN layer on the hole surface comprises the steps of:
    forming the metal layer with the interposed WN layer on the mold insulating layer including the hole;
    forming a sacrifice layer on the metal layer with the interposed WN layer to fill up the hole with the sacrifice layer;
    removing the sacrifice layer and the metal layer with the interposed WN layer on the mold insulating layer to expose the mold insulating layer; and
    removing the residual sacrifice layer.

13. The method as claimed in claim 8, wherein the dielectric layer is any single layer selected from the group consisting of Al2O3, HfO2, La2O3, TiO2 and SrTiO3 layers according to an Atomic Layer Deposition (ALD) process or a laminate layer including at least two of them.

14. The method as claimed in claim 8, wherein the plate electrode consists of a TiN layer according to a Chemical Vapor Deposition (CVD) process.

15. The method as claimed in claim 11, wherein Ar gas or a gas mixture of Ar and H2 is used as the purge gas.

16. The method as claimed in claim 11, wherein the WN layer is formed with a thickness of 20 to 100 Å at a temperature of 260 to 35° C.

17. The method as claimed in claim 12, wherein the sacrifice layer is a plasma enhanced-tetra ethyl ortho silicate (PE-TEOS) oxide layer or a spin on glass (SOG) oxide layer.

18. The method as claimed in claim 12, wherein the sacrifice layer is a photoresist layer.

19. The method as claimed in claim 12, wherein the sacrifice layer is formed with a thickness of 500 to 3000 Å.

* * * * *